(12) United States Patent
Stadler et al.

(10) Patent No.: US 7,829,467 B2
(45) Date of Patent: Nov. 9, 2010

(54) METHOD FOR PRODUCING A POLISHED SEMICONDUCTOR

(75) Inventors: Maximilian Stadler, Haiming (DE); Günter Schwab, Neuötting (DE); Diego Feijóo, Burghausen (DE); Karlheinz Langsdorf, Burghausen (DE)

(73) Assignee: Siltronic AG, Munich (DE)

( * ) Notice: Subject to any disclaimer, the term of this patent is extended or adjusted under 35 U.S.C. 154(b) by 858 days.

(21) Appl. No.: 11/744,231

(22) Filed: May 4, 2007

(65) Prior Publication Data

US 2007/0259531 A1 Nov. 8, 2007

(30) Foreign Application Priority Data

May 4, 2006 (DE) ................. 10 2006 020 823

(51) Int. Cl.
  *H01L 21/302* (2006.01)
  *H01L 21/461* (2006.01)
(52) U.S. Cl. ................. 438/704; 257/E21.219; 257/E21.23; 438/706
(58) Field of Classification Search ................. None
  See application file for complete search history.

(56) References Cited

U.S. PATENT DOCUMENTS

| | | | |
|---|---|---|---|
| 5,429,711 A * | 7/1995 | Watanabe et al. | 438/464 |
| 5,948,699 A * | 9/1999 | Lawrence et al. | 438/692 |
| 5,980,720 A * | 11/1999 | Park et al. | 205/118 |
| 5,998,281 A * | 12/1999 | Aga et al. | 438/459 |
| 6,013,564 A * | 1/2000 | Muramatsu | 438/460 |
| 6,074,947 A * | 6/2000 | Mumola | 438/689 |
| 6,114,245 A * | 9/2000 | Vandamme et al. | 438/690 |
| 6,214,704 B1 * | 4/2001 | Xin | 438/471 |
| 6,376,335 B1 * | 4/2002 | Zhang et al. | 438/471 |
| 6,376,395 B2 * | 4/2002 | Vasat et al. | 438/795 |
| 6,491,836 B1 * | 12/2002 | Kato et al. | 216/88 |
| 6,566,267 B1 * | 5/2003 | Wenski | 438/692 |
| 6,861,360 B2 * | 3/2005 | Wenski et al. | 438/693 |
| 7,250,368 B2 * | 7/2007 | Kida et al. | 438/690 |

(Continued)

FOREIGN PATENT DOCUMENTS

DE 102 10 023 A1 5/2003

(Continued)

OTHER PUBLICATIONS

Derwent Abstract of DE 102 10 023 A1, (2003).

(Continued)

*Primary Examiner*—Allan Olsen
(74) *Attorney, Agent, or Firm*—Brooks Kushman P.C.

(57) ABSTRACT

Semiconductor wafers are cut from a crystal and subjected to a series of processing steps in which material is removed from a front side and a rear side of the semiconductor wafers, comprising the following processing steps:
  a mechanical processing step,
  an etching step in which the semiconductor wafers are oxidized and material is removed from the front side of the wafers with the aid of a gaseous etchant containing hydrofluoric acid at a temperature of 20 to 70° C., and a polishing step in which the front side of the semiconductor wafer is polished, the processing steps in which the front side of the semiconductor wafer is polished causing material removal which does not amount to more than 5 μm in total.

16 Claims, 2 Drawing Sheets

Effect of the Gas Phase Etching Removal on the Roughness ( Chapman, 250 μm filter )

U.S. PATENT DOCUMENTS

| | | |
|---|---|---|
| 7,416,962 B2 * | 8/2008 | Harrison et al. ............. 438/459 |
| 7,510,664 B2 * | 3/2009 | Carr ............................ 216/24 |
| 2001/0014570 A1 * | 8/2001 | Wenski et al. ................. 451/41 |
| 2001/0039101 A1 * | 11/2001 | Wenski ....................... 438/471 |
| 2002/0004305 A1 * | 1/2002 | Vasat et al. ................. 438/690 |
| 2002/0174828 A1 * | 11/2002 | Vasat et al. ................... 117/90 |
| 2003/0008478 A1 * | 1/2003 | Abe et al. ................... 438/459 |
| 2003/0068891 A1 * | 4/2003 | Bang et al. ................. 438/689 |
| 2003/0109139 A1 * | 6/2003 | Wenski et al. .............. 438/692 |
| 2003/0186028 A1 * | 10/2003 | Wenski et al. .............. 428/141 |
| 2004/0020513 A1 | 2/2004 | Bergman |
| 2004/0035448 A1 * | 2/2004 | Aegerter et al. ............... 134/33 |
| 2007/0202660 A1 * | 8/2007 | Moriceau et al. ............ 438/424 |
| 2007/0259531 A1 * | 11/2007 | Stadler et al. ............... 438/704 |

FOREIGN PATENT DOCUMENTS

| | | |
|---|---|---|
| DE | 10 2004 062 355 A | 7/2006 |

OTHER PUBLICATIONS

US 2004/0020513 is the English translation of DE 10 2004 062 355 A1.

* cited by examiner

METHOD FOR PRODUCING A POLISHED SEMICONDUCTOR

BACKGROUND OF THE INVENTION

1. Field of the Invention

The invention relates to a method for producing a polished semiconductor wafer, the semiconductor wafer being cut from a crystal and subjected to a series of processing steps.

2. Background Art

After having cut semiconductor wafers from a crystal, for example a silicon crystal, the production of polished semiconductor wafers requires a series of processing steps which can be broadly divided into two groups according to their purpose: shaping process steps (wafering steps) and smoothing process steps. The shaping process steps are intended in particular to give the semiconductor wafers a shape which is distinguished by a rounded edge and plane-parallel opposite sides. In the further course of the method at least one of the sides, usually the front side, is brought into a polished state in which it then only has minor roughness and is therefore outstandingly suitable as a substrate for the production of electronic circuits. Besides rounding the edge of the semiconductor wafer, the shaping process steps involve in particular lapping and grinding the sides. The latter two mechanical processing steps may be applied together, lapping followed by grinding, or in such a way that only one of the two processing steps is carried out. The grinding of a side may be subdivided into coarse and fine grinding steps. In coarse grinding, material is removed more coarsely and rapidly, leaving greater roughness, as well as damage extending more deeply into the crystal lattice. In fine grinding, the situation is the reverse. The grinding may furthermore be restricted to one side of the semiconductor wafer, or include both sides of the semiconductor wafer. If both sides are to be ground, then this may be done successively or in one step. The wafer geometry achieved at the end of the shaping process steps, which is a measure of the shape achieved, and which, for example is reflected by the thickness variation or overall planarity, cannot generally be further increased by subsequent processing steps which smooth the surfaces. Rather, the problem is encountered that the geometry achieved after the shaping is only worsened by subsequent processing steps.

Since superficial regions of the semiconductor wafer become damaged in the course of the shaping process steps, it is also an aim of the subsequent smoothing process steps to remove the damaged regions. These processing steps include in particular etching and polishing steps. During the etching, a liquid etchant is allowed to act on the semiconductor wafer, for example by immersing the semiconductor wafer in the etchant and optionally forcing the etchant to flow around the wafer. It is known that liquid etchants with an alkaline pH, which contain for example KOH, scarcely compromise the semiconductor wafer's geometry achieved after the shaping process steps. However, they have the disadvantage of causing an increase in the roughness of the surface. Furthermore, alkaline etchants often are a source of contamination of the semiconductor wafer by traces of metal. Liquid etchants with a pH in the acid range, for example those which contain a mixture of HF and $HNO_3$, do not exhibit this disadvantage but perform less well than alkaline etchants as related to preserving the wafer geometry. It has therefore already been proposed to use alkaline and acidic etchants in succession, in which case their respective advantages can be combined and their respective disadvantages have less of an effect.

U.S. published application 2004/0020513 A1 describes a method for thinning a semiconductor wafer by means of gas phase etching in which HF in the gaseous state, generally as vapor, acts on the semiconductor wafer and dissolves oxide present on the semiconductor wafer to form water and $SiF_4$. In order to form the oxide, an oxidant such as $O_3$ is required, which is first allowed to act on the semiconductor wafer's surface to be processed with HF. The timing of the process may also be configured so that HF and the oxidant act simultaneously. Particular advantages of gas phase etching are that the etchant consumption is substantially less than when using liquid etchants, and that the cleaning of the semiconductor wafer, which is carried out after etching with a liquid etchant, does not need to be so intense, or may even be entirely eliminated.

Parameters such as freedom from defects freedom and planarity, which the producers of electronic circuits require in particular for the front surface of a semiconductor wafer, are much too demanding to be fulfilled only with the aid of etching steps. Rather, it is also necessary to carry out at least one polishing step by which damaged crystal regions are removed and the roughness of at least the front side is reduced. It is found particularly expedient to employ stock polishing, including both sides of the semiconductor wafer, with material removal of approximately at least 10 µm per wafer side, which is followed by mirror polishing restricted to the front side with material removal of less than 1 µm. The stock polishing of both sides may be carried out as simultaneously performed double-sided polishing, or may comprise two single-sided polishing steps carried out successively. Against the advantageous effect of polishing, there are the disadvantages that polishing represents a comparatively expensive processing step which consumes high-grade polishing agents and polishing cloths, and that the stock polishing unfavorably affects the semiconductor wafer's geometry achieved by the shaping process steps. Furthermore, metal traces contained in the polishing agent may be transferred onto and into the semiconductor wafer, an effect which also depends on the duration of the polishing.

SUMMARY OF THE INVENTION

In view of the multiple requirements which polished semiconductor wafers are required to satisfy, and in view of the sometimes conflicting effects of the processing steps available to them, it is an object of the present invention to provide a method sequence which complies fully with the requirements for quality of the semiconductor wafer and which is also economical. These and other objects are achieved by mechanically processing the wafer, followed by a gaseous HF etch of the wafer front surface, and polishing the front surface while limiting material removal to a very small amount, for example 5 µm or less.

DETAILED DESCRIPTION OF THE PREFERRED EMBODIMENT(S)

Figure 1:
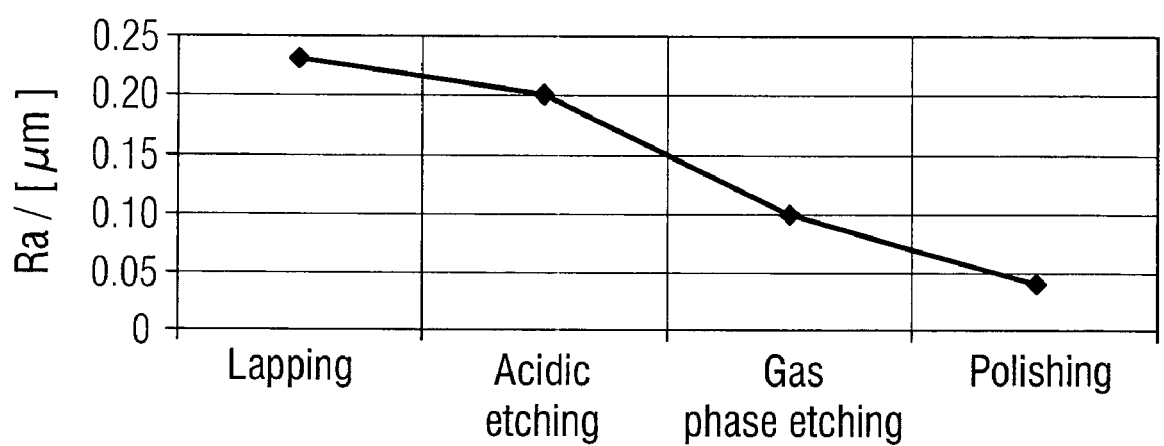
FIG. 1 illustrates decrease in surface roughness at various points of one embodiment of the subject invention process.

The invention relates to a method for producing a semiconductor wafer, the semiconductor wafer being cut from a crystal and subjected to a series of processing steps in which material is removed from a front side and a rear side of the semiconductor wafer, comprising the following processing steps:

a mechanical processing step, an etching step in which the semiconductor wafer is oxidized and material is removed from the front side of the semiconductor wafer with the aid of a gaseous etchant which contains hydrofluoric acid at a temperature of from 20 to 70° C., and at least one polishing step in which the front side of the semiconductor wafer is polished, the processing steps in which the front side of the semiconductor wafer is polished causing material removal which in total does is not more than 5 µm.

The method comprises gas phase etching of at least the front side, as a processing step which is used to smooth the processed side of the semiconductor wafer. The fact that gas phase etching exerts a smoothing effect, i.e. one which reduces the roughness, was neither known nor to be expected. The smoothing effect can already be observed after a small amount of material has been removed. Integrating the gas phase etching into the chain of smoothing process steps, in particular as a processing step which precedes the stock polishing, allows a significant reduction of the overall removal from a side of the semiconductor wafer without losing quality. The reduced overall removal is due in particular to the fact that the stock polishing can be shortened, so that overall, i.e. including the mirror polishing, no more than 5 µm of material, particularly preferably no more than 2.5 µm of material needs to be removed from a side of the semiconductor wafer. Depending on the requirements for planarity of the side of the semiconductor wafer, the stock polishing may even be entirely obviated. The use of gas phase etching for the purpose of smoothing thus makes it possible to substantially avoid the previously described problems associated with stock polishing, without thereby having to tolerate other disadvantages.

The gas phase etching preferably takes place in a humid environment, i.e. in the presence of supplied water. For example, water is sprayed onto the semiconductor wafer's side to be processed before the gas phase etching commences. As an alternative, the oxidant or the gaseous etchant or both may be enriched with water, for example by passing these substances through water before they reach the semiconductor wafer. The oxidant, which is preferably $O_3$, is fed before or together with the gaseous etchant to the semiconductor wafer's side to be processed. Instead of pure water, water containing ozone may be supplied to the semiconductor wafer's side to be processed. Besides HF, the gaseously supplied etchant may contain one or more further substances, for example a carrier gas such as $N_2$, water vapor or $O_3$. Additives such as isopropanol, which enhance the wetting of the wafer surface, may also be added. The gas phase etching of the semiconductor wafer preferably takes place in the form of single-wafer processing, during which the front side or the front and rear sides of the semiconductor wafer are etched simultaneously. A reactor suitable therefor is described, for example, in US2004/0020513 A1 which was cited above. It is nevertheless also possible to subject a plurality of semiconductor wafers to the gas phase etching simultaneously, in which case there is again a choice between one-sided or two-sided processing.

The gas phase etching is carried out at a temperature of from 20 to 70° C., at least the semiconductor wafer, the supplied etchant or the supplied water being brought to this temperature. A temperature range of from 30 to 70° C. is preferred, because the smoothing of the processed side takes place too slowly at temperatures lying below this and no smoothing effect takes place at temperatures lying above, rather the roughness of the processed side increases. A temperature in the region of 40° C. is particularly preferred.

The gas phase etching preferably comprises several substeps at the start and end of which, there is preferred to be a short washing step in which the processed side of the semiconductor wafer is washed with water. Such a substep, which is preferably repeated from 1 to 20 times, more preferably from 5 to 10 times, consists for example in spraying the semiconductor wafer's side to be processed with water, supplying gaseous etchant which contains HF or $O_3$ to the semiconductor wafer's side to be processed and washing this side with water after a particular action time has elapsed. As regards supplying water, HF and oxidant, the alternatives mentioned above may naturally also be employed instead of this.

By using the gas phase etching, the aim of the invention is to smooth the wafer side processed therewith so as to minimize the removal of material which is required by the use of other smoothing process steps, in order to achieve a target geometry of the semiconductor wafer and a target planarity of the processed sides of the semiconductor wafer. This aim is to be regarded as having been achieved when an overall removal by all processing steps apart from the mechanical processing steps employed amounts to no more than 25 µm on a wafer side, and of this the removal of material due to the stock polishing amounts to no more than 5 µm. The contribution by the gas phase etching to the overall removal of material depends on the roughness which the semiconductor wafer's side to be processed exhibits before the gas phase etching. For example, gas phase etching which takes place after a lapping step requires more removal of material in order to achieve particular smoothing, than gas phase etching which takes place after a fine grinding step. The material removal caused by the gas phase etching of a side of the semiconductor wafer is preferably from 0.1 to 4 µm, more preferably from 1 to 2 µm. Thinning of the semiconductor wafer, as understood in US2004/0020513 A1, does not thereby take place.

The material removal achieved by etching in the liquid phase preferably amounts to from 2 to 50 µm, more preferably from 5 to 15 µm. It is possible to use liquid etchants with an alkaline or acidic pH. Liquid etchants with a pH in the acid range, which contain a mixture of HF and $HNO_3$, and alkaline etchants which contain KOH, are particularly preferred. Likewise preferred is a combined use of such etchants, particularly in the sequence of first etching with the alkaline etchant, in which case from 1 to 4 µm, more preferably from 2 to 3 µm of material are removed, and subsequently, optionally after an intermediate step of washing with water, etching with the acidic etchant, in which case from 10 to 15 µm of material are removed.

The material removal of not more than 5 µm achieved by stock polishing preferably amounts to from just greater than 0 µm to 5 µm, more preferably from 3 µm to 5 µm and, which is likewise preferred, is achieved by double-sided polishing in which both sides of the semiconductor wafer are polished simultaneously. This is lastly followed by final mirror polishing, in which the semiconductor wafer's side intended to form the basis for the production of electronic circuits, generally the front side, is polished. The material removal by the mirror polishing amounts to less than 1 µm, preferably from 0.05 µm to 1 µm, most preferably from 0.1 µm to 0.3 µm.

As regards the shaping process steps which take place after cutting the semiconductor wafer from a crystal, those sequences of processing steps are particularly preferred which comprise at least one lapping step, or at least one coarse grinding step in which both sides of the semiconductor wafer are ground simultaneously, or else those which comprise a combination of a lapping step and such a coarse grinding step. The following sequences of processing steps are furthermore particularly preferred:

a) an etching step in a liquid phase, followed by gas phase etching at least of the front side, carried out in one of the ways described above, followed by double-sided polishing performed as stock polishing with material removal as described above, followed by mirror polishing of the front side with material removal as described above, b) a step of fine-grinding the front side or both sides of the semiconductor wafer, followed by processing steps according to list a), c) an etching step in a liquid phase, followed by a step of fine-grinding the front side or both sides of the semiconductor wafer, followed by gas phase etching at least of the front side, carried out in one of the ways described above, followed by double-sided polishing performed as stock polishing with material removal as described above, followed by mirror polishing of the front side with material removal as described above, d) a step of fine-grinding the front side or both sides of the semiconductor wafer, followed by gas phase etching at least of the front side, carried out in one of the ways described above, followed by double-sided polishing performed as stock polishing with material removal as described above, followed by mirror polishing of the front side with material removal as described above, e) a step of fine-grinding the front side or both sides of the semiconductor wafer, followed by gas phase etching at least of the front side, carried out in one of the ways described above, followed by mirror polishing of the front side with material removal as described above, f) gas phase etching at least of the front side, carried out in one of the ways described above, followed by double-sided polishing performed as stock polishing with material removal as described above, followed by mirror polishing of the front side with material removal as described above.

g) gas phase etching at least of the front side, carried out in one of the ways described above, followed by an etching step in a liquid phase, followed by double-sided polishing performed as stock polishing with material removal as described above, followed by mirror polishing of the front side with material removal as described above.

According to a sequence of processing steps which is not covered by the present invention, gas phase etching of the front side is obviated and the gas phase etching is used only to smooth the rear side, while the front side is processed in a conventional way. Such a sequence comprises for example an etching step in a liquid phase with an etchant having an alkaline pH, followed by gas phase etching of the substrate rear side, carried out in one of the ways described above, followed by double-sided polishing performed as stock polishing with material removal as described above, followed by mirror polishing of the front side with material removal as described above.

In addition to the processing steps mentioned above, the method sequence according to the invention may incorporate further treatment steps which do not cause any removal of material from the sides of the semiconductor wafer, for example washing and cleaning steps, edge rounding and edge polishing steps, the application of laser markings and drying treatments. A polished semiconductor wafer produced in this way may be used directly as a substrate for electronic circuits or may be processed further to form layer substrates such as SOI substrates (silicon on insulator substrates), substrates having an epitaxially deposited layer (epi layer) or having a strained layer (strained silicon layer).

EXAMPLE 1

Lapped semiconductor wafers of silicon with a diameter of 300 mm and a roughness Ra of 0.23 μm on the sides (measured by a Perthometer contact measuring device from the manufacturer Hommel) were processed by processing steps according to sequence a) above. The etching step in a liquid phase took place with an etchant having a pH in the acidic range and lead to material removal of 10 μm on the etched side. By the subsequent gas phase etching, 2 μm of material were removed from the etched front side and a further 5 μm in total were removed from this side by the final polishing. FIG. 1 graphically represents the change in the roughness Ra of the front side of the semiconductor wafers in the course of the processing steps.

EXAMPLE 2

Figure 2:
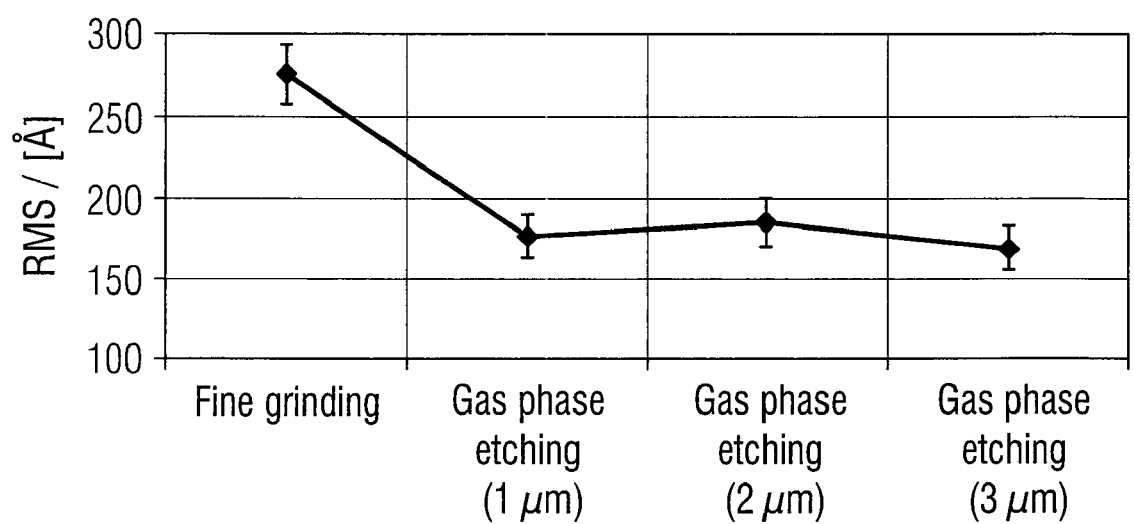
FIG. 2 illustrates the relationship between length of gas phase etching and surface roughness.

Semiconductor wafers of silicon with a diameter of 300 mm and finely ground sides were etched and polished according to sequence c) above. FIG. 2 represents the RMS roughness, measured by a Chapman MP 2000/1 profiler, after the fine grinding and after the gas phase etching. By virtue of an already low roughness after the fine grinding (275 Å RMS with a 250 μm filter) material removal of 1 μm by gas phase etching led to smoothing (175 Å RMS with a 250 μm filter) which could not be increased further through greater removal of material by gas phase etching.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a semiconductor wafer, the semiconductor wafer being cut from a crystal and subjected to a series of processing steps in which material is removed from a front side and a rear side of the semiconductor wafer, comprising the following processing steps:

a mechanical processing step, an etching step in which the semiconductor wafer is oxidized and material is removed from the front side of the semiconductor wafer with the aid of a gaseous etchant which contains hydrofluoric acid, at a temperature of from 20 to 70° C., and a polishing step in which the front side of the semiconductor wafer is polished, the processing steps in which the front side of the semiconductor wafer is polished causing material removal which amounts to no more than 5 μm in total.

2. The method of claim 1, wherein apart from the mechanical processing steps, the steps of processing the front side of the semiconductor wafer cause material removal from the front side of the semiconductor wafer which amounts to no more than 25 μm in total.

3. The method of claim 1, wherein apart from the mechanical processing steps, the steps of processing the rear side of the semiconductor wafer cause material removal from the rear side of the semiconductor wafer which does not amount to more than 25 μm in total.

4. The method of claim 1, wherein the front side of the semiconductor wafer is processed with the aid of the gaseous etchant at a temperature of from 30 to 70° C.

5. The method of claim 2, wherein the front side of the semiconductor wafer is processed with the aid of the gaseous etchant at a temperature of from 30 to 70° C.

6. The method of claim 1, wherein the gaseous etchant contains an oxidant.

7. The method of claim 1, wherein the gaseous etchant contains isopropanol.

8. The method of claim 1, wherein the gaseous etchant contains water.

9. The method of claim 1, wherein the processing steps comprise the step sequence: an etching step in a liquid phase, an etching step with gaseous etchant, double-sided polishing performed as stock polishing and mirror polishing of the front side.

10. The method of claim 1, wherein the processing steps comprise the step sequence: a step of fine-grinding the front side or the front and rear sides of the semiconductor wafer, an etching step in a liquid phase, an etching step with gaseous etchant, double-sided polishing performed as stock polishing and mirror polishing of the front side.

11. The method of claim 1, wherein the processing steps comprise the step sequence: an etching step in a liquid phase, a step of fine-grinding the front side or the front and rear sides of the semiconductor wafer, an etching step with gaseous etchant, double-sided polishing performed as stock polishing and mirror polishing of the front side.

12. The method of claim 1, wherein the processing steps comprise the step sequence: a step of fine-grinding the front side or the front and rear sides of the semiconductor wafer, an etching step with the gaseous etchant, double-sided polishing performed as stock polishing and mirror polishing of the front side.

13. The method of claim 1, wherein the processing steps comprise the step sequence: a step of fine-grinding the front side or the front and rear sides of the semiconductor wafer, an etching step with the gaseous etchant, and mirror polishing of the front side.

14. The method of claim 1, wherein the processing steps comprise the step sequence: an etching step with gaseous etchant, double-sided polishing performed as stock polishing, and mirror polishing of the front side.

15. The method of claim 1, wherein the processing steps comprise the step sequence: an etching step with the gaseous etchant, an etching step in a liquid phase, double-sided polishing performed as stock polishing, and mirror polishing of the front side.

16. The method of claim 1, which method comprises an etching step in which material is removed from the rear side of the semiconductor wafer with the aid of a gaseous etchant.

* * * * *